(12) United States Patent
Blanchard et al.

(10) Patent No.: US 7,989,293 B2
(45) Date of Patent: Aug. 2, 2011

(54) TRENCH DEVICE STRUCTURE AND FABRICATION

(75) Inventors: Richard A. Blanchard, Los Altos, CA (US); Jun Zeng, Torrance, CA (US)

(73) Assignee: MaxPower Semiconductor, Inc., Campbell, CA (US)

( * ) Notice: Subject to any disclaimer, the term of this patent is extended or adjusted under 35 U.S.C. 154(b) by 0 days.

(21) Appl. No.: 12/391,450

(22) Filed: Feb. 24, 2009

(65) Prior Publication Data

US 2010/0214016 A1    Aug. 26, 2010

(51) Int. Cl.
*H01L 21/336*    (2006.01)

(52) U.S. Cl. ............... 438/270; 257/330; 257/E21.135; 257/E21.144

(58) Field of Classification Search .......... 438/197, 438/206, 207, 270, 271; 257/E21.149, E21.468
See application file for complete search history.

(56) References Cited

U.S. PATENT DOCUMENTS

| | | | |
|---|---|---|---|
| 5,282,018 A | 1/1994 | Hiraki et al. | |
| 5,637,898 A | 6/1997 | Baliga | |
| 5,864,159 A | 1/1999 | Takahashi | |
| 5,973,359 A | 10/1999 | Kobayashi | |
| 5,998,833 A | 12/1999 | Baliga | |
| 6,040,212 A * | 3/2000 | Kim | 438/242 |
| 6,069,372 A | 5/2000 | Uenishi | |
| 6,114,727 A | 9/2000 | Ogura et al. | |
| 6,191,447 B1 | 2/2001 | Baliga | |
| 6,251,730 B1 | 6/2001 | Luo | |
| 6,285,060 B1 * | 9/2001 | Korec et al. | 257/342 |
| 6,388,286 B1 | 5/2002 | Baliga | |
| 6,525,373 B1 | 2/2003 | Kim | |
| 6,541,820 B1 | 4/2003 | Bol | |
| 6,649,975 B2 | 11/2003 | Baliga | |
| 6,683,346 B2 | 1/2004 | Zeng | |
| 6,686,244 B2 | 2/2004 | Blanchard | |
| 6,710,403 B2 | 3/2004 | Sapp | |
| 6,803,627 B2 | 10/2004 | Pfirsch | |
| 6,987,040 B2 * | 1/2006 | Venkatraman | 438/212 |
| 7,544,571 B2 | 6/2009 | Park | |
| 2001/0041407 A1 | 11/2001 | Brown | |
| 2003/0073287 A1 | 4/2003 | Kocon | |
| 2003/0203576 A1 | 10/2003 | Kitada et al. | |
| 2005/0242392 A1 * | 11/2005 | Pattanayak et al. | 257/328 |
| 2006/0060916 A1 | 3/2006 | Girdhar et al. | |
| 2010/0065904 A1 * | 3/2010 | Pan et al. | 257/330 |

OTHER PUBLICATIONS

J. T. Watt, B. J. Fishbein & J. D. Plummer; Low-Temperature NMOS Technology with Cesium-Implanted Load Devices; IEEE Trans. Electron Devices, vol. 34, # 1, Jan.'87; p. 28-38.

(Continued)

*Primary Examiner* — Ha Tran T Nguyen
*Assistant Examiner* — Shaka Scarlett
(74) *Attorney, Agent, or Firm* — Robert Groover; Storm LLP (57) ABSTRACT

A vertical-current-flow device includes a trench which includes an insulated gate and which extends down into first-conductivity-type semiconductor material. A phosphosilicate glass layer is positioned above the insulated gate and a polysilicon layer is positioned above the polysilicate glass layer. Source and body diffusions of opposite conductivity types are positioned adjacent to a sidewall of the trench. A drift region is positioned to receive majority carriers which have been injected by the source, and which have passed through the body diffusion. A drain region is positioned to receive majority carriers which have passed through the drift region. The gate is capacitively coupled to control inversion of a portion of the body region. As an alternative, a dielectric layer may be used in place of the doped glass where permanent charge is positioned in the dielectric layer.

13 Claims, 12 Drawing Sheets

OTHER PUBLICATIONS

J.T.Watt,B.J.Fishbein & J.D.Plummer;Characterization of Surface Mobility in MOS Structures Containing Interfacial Cesium Ions;IEEE Trans.Electron Devices,V36,Jan.'89; p. 96-100.

J.R.Pfiester, J.R.Alvis & C.D.Gunderson; Gain-Enhanced LDD NMOS Device Using Cesium Implantation; IEEE Trans.Electron Devices, V39, #6, Jun.'92; P. 1469-1476.

* cited by examiner

Cell Structure With N LDD

FIG 12

Cell Structure Without N LDD

FIG 13

Split-Gate With Polycide  FIG 15

Split-Gate  FIG 14

TRENCH DEVICE STRUCTURE AND FABRICATION

BACKGROUND

The present application relates to semiconductor devices, and more particularly to trench device structure and fabrication.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF SAMPLE EMBODIMENTS

Trench MOSFET devices being manufactured today have their source regions formed by implanting the required dopant species.

Note that the points discussed below may reflect the hindsight gained from the disclosed inventions, and are not necessarily admitted to be prior art.

Figure 1:
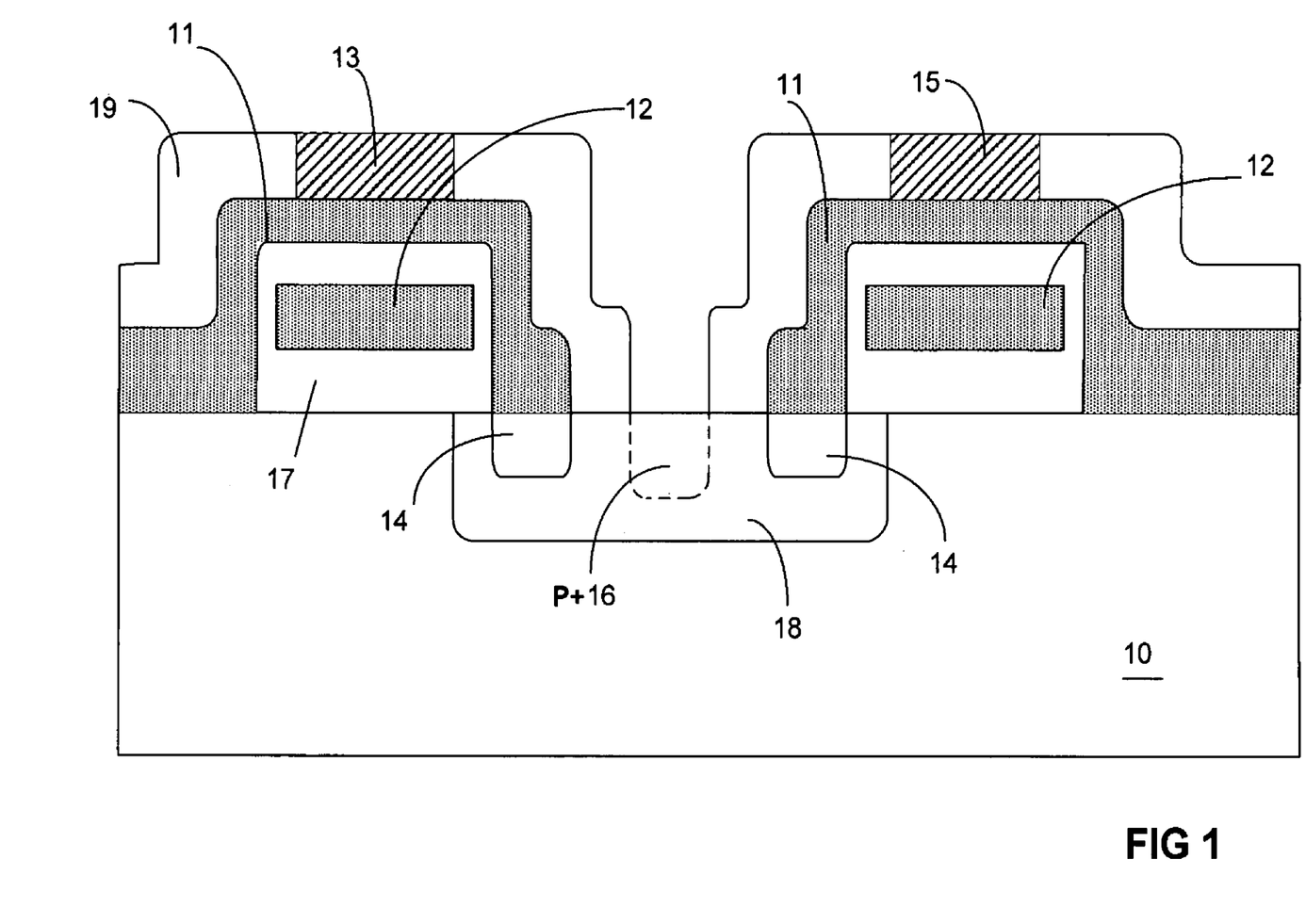
FIG. 1 is a cross-sectional view of a vertical DMOS transistor having its source dopant diffused from a doped polycrystalline layer.

With reference to FIG. 1, a vertical DMOS transistor is shown. This Figure is from U.S. Pat. No. 5,663,079, which is incorporated by reference in the present application. Gate regions 12 are formed within a gate dielectric layer 17. P− body regions 18 are diffused into the epi layer (or substrate) 10. A second layer of polycrystalline silicon 11 is deposited. The second polysilicon layer 11 is N-type doped using phosphorus, arsenic or antimony.

A layer of silicon dioxide 19 is deposited on the polysilicon 11 and the exposed parts of the silicon substrate 10, The n-type dopant in the second polysilicon layer 11 forms the diffused n-type source regions 14. P-type dopant is introduced and diffused to the desired depth forming p+ region 16 which is shown as being shallower than p− body region 18, but may be the same depth, or deeper, than p− body region 18. Separate contact regions 13, 15 are opened through insulating layer 19 to the polysilicon layer to electrically contact the source region 14. This structure allows the contact to the source polysilicon to be made a distance from the diffused source region in the silicon.

A trench-gated MOSFET includes a trench, which contains a dielectric layer on its bottom and at least partially on it sides. This dielectric layer, which extends down into first-conductivity-type semiconductor material separates this first-conductivity-type semiconductor material from the gate conductor, which may be polycrystalline silicon, a polycide or a silicide. A phosphosilicate glass layer is positioned above the conductive gate material and a phosphorus doped polysilicon layer is positioned above the phosphosilicate glass layer. Source and body diffusions of opposite conductivity types are positioned adjacent to a sidewall of the trench. A drift region is positioned to receive majority carriers which have been injected by the source, and which have passed through the body diffusion. A drain region is positioned to receive majority carriers which have passed through the drift region. The gate is capacitively coupled to the semiconductor material to control inversion of a portion of the body region. As an alternative, a dielectric layer may be used in place of the doped glass where permanent or fixed charge is positioned in the dielectric layer.

The disclosed innovations, in various embodiments, provide one or more of at least the following advantages. However, not all of these advantages result from every one of the innovations disclosed, and this list of advantages does not limit the various claimed inventions.

Enables a DMOS structure having its source contacts on the trench sidewall.

Enables the fabrication of DMOS transistors having a smaller pitch or cell size, and therefore having a lower on-resistance per unit area.

The numerous innovative teachings of the present application will be described with particular reference to presently preferred embodiments (by way of example, and not of limitation). The present application describes several inventions, and none of the statements below should be taken as limiting the claims generally.

A trench MOSFET structure and process that has its source dopant introduced through the sidewall of the trench from doped polysilicon is disclosed. In addition, the dopant concentration in the body region may be selected so that the breakdown voltage of the device is set by the net dopant concentration in the body region away from the channel region. The process flow and the resulting structure is shown in the figures below.

The following description pertains to an n-channel device. Conductivity types would be reversed for a p-channel device.

Figure 2:
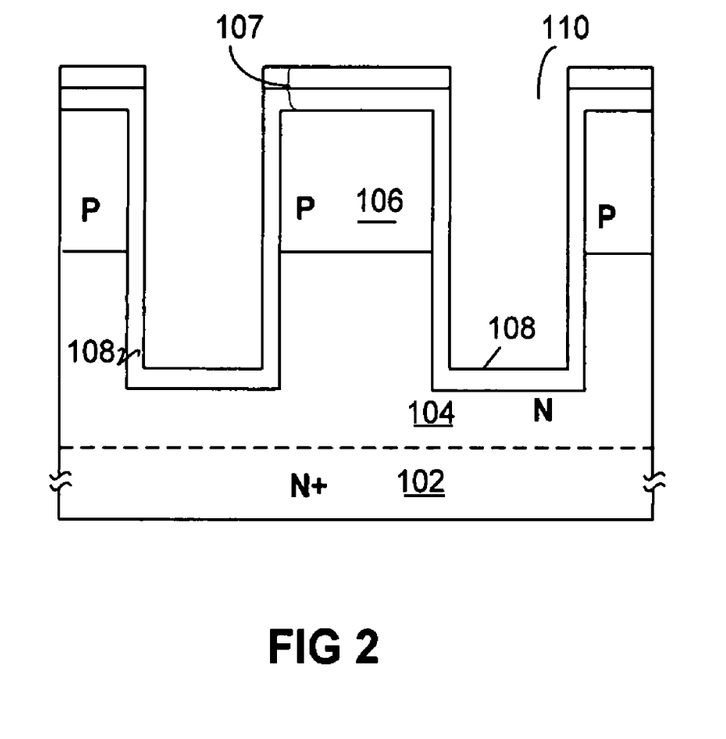
FIG. 2 is a cross-sectional structural diagram depicting a stage in a fabrication process for a semiconductor device, in accordance with an embodiment.

With reference to FIGS. 2-8, cross-sectional structural diagrams depict stages in a device fabrication process, in accordance with an embodiment. As shown in FIG. 2, an n-type epitaxial layer 104 is deposited on an N+ wafer 102. A p-type epitaxial layer 106 is deposited or a p-type dopant is introduced. (For the sake of simplicity, only one p-type body region is shown. One of ordinary skill knows that additional p or p+ regions may be formed having profiles that are shallower than, the same depths, or deeper than the first body across part or all of the first p-type region) A dielectric layer or sandwich 107 is formed on the wafer surface. A mask may be used to etch trenches 110. A gate oxide or dielectric sandwich layer 108 is formed. Although the dielectric layer 108 may be formed by more than one process, it may not be possible to distinguish any boundaries between the oxides at the top corners of the trenches.

Figure 3:
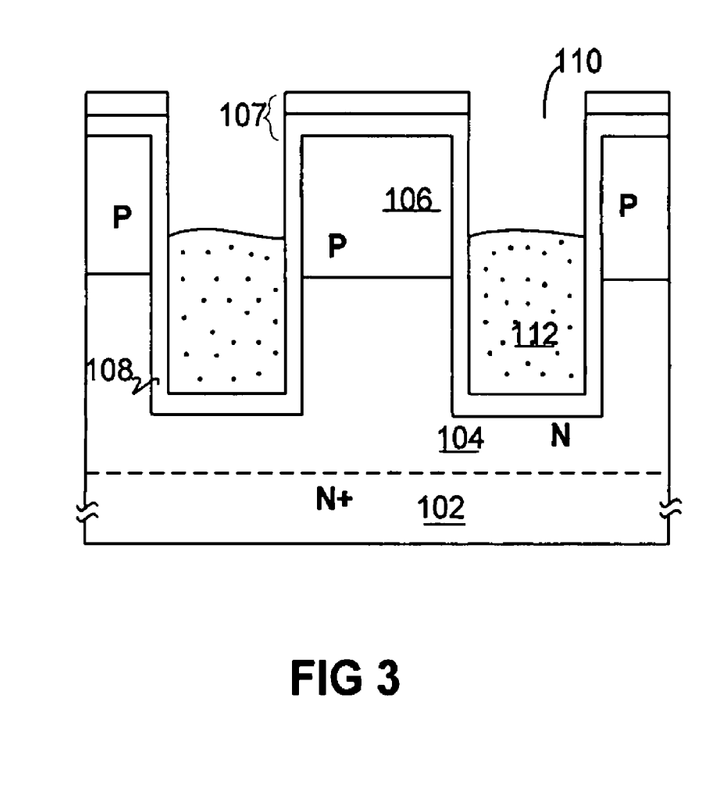
FIG. 3 is a cross-sectional structural diagram depicting a stage in a fabrication process for a semiconductor device, in accordance with an embodiment.

In FIG. 3, the trenches 110 are filled by depositing polysilicon. The polysilicon is then etched anisotropically to leave a polysilicon gate electrode 112. (Contact to the polysilicon gate will be made out of the plane of this figure, so the structure needed for this contact is not shown in the figures.)

Figure 4:
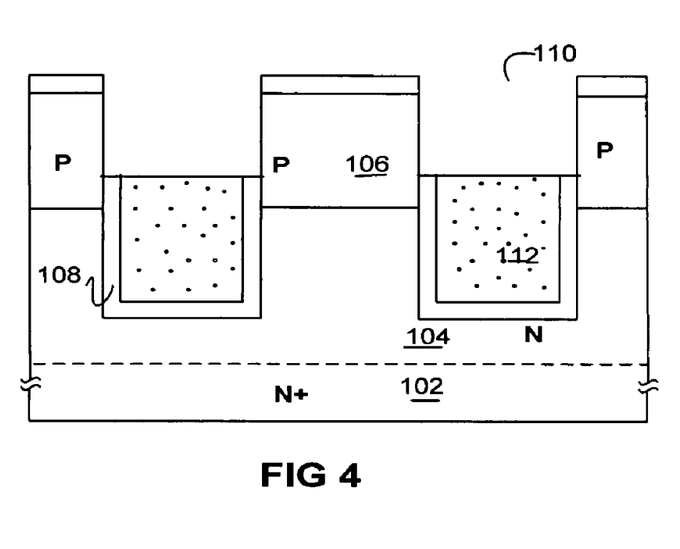
FIG. 4 is a cross-sectional structural diagram depicting a stage in a fabrication process for a semiconductor device, in accordance with an embodiment.

In FIG. 4, the upper layer of dielectric sandwich 107 in FIG. 2 has been removed as has been the upper portion of layer 108 (layer 108 may be only thinned as well.

Figure 5:
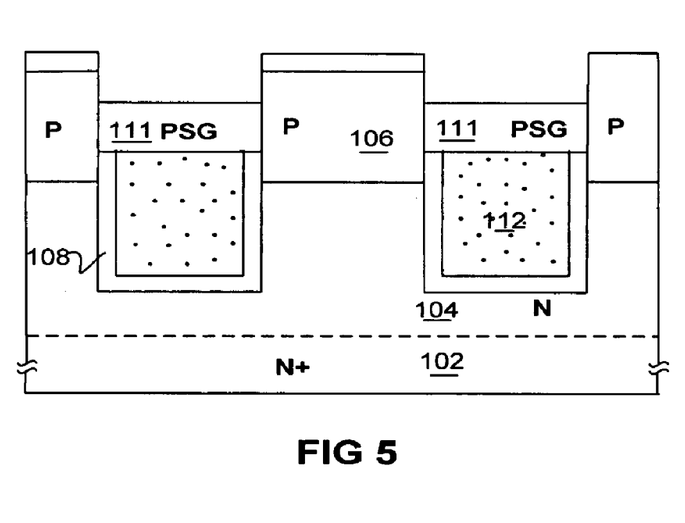
FIG. 5 is a cross-sectional structural diagram depicting a stage in a fabrication process for a semiconductor device, in accordance with an embodiment.

In FIG. 5, a layer of doped oxide containing an n-type dopant such as phosphosilicate glass (PSG) 111, has been formed above the gate 112 by a deposition and etching process similar to that used to form gate electrode 112.

Figure 6:
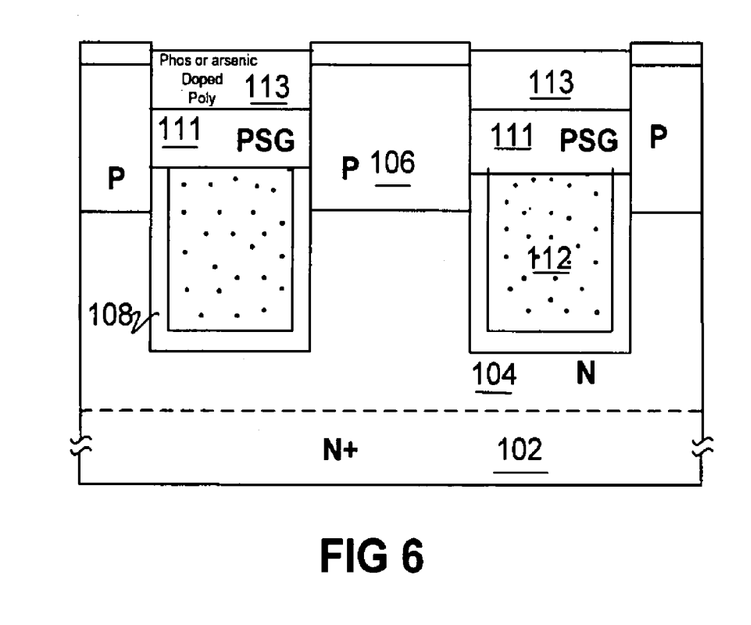
FIG. 6 is a cross-sectional structural diagram depicting a stage in a fabrication process for a semiconductor device, in accordance with an embodiment.

In FIG. 6, a layer of phosphorus-doped, arsenic-doped, or antimony doped polysilicon 113 has been formed above the layer of PSG 111, again by a deposition and etching process similar to that used to form the gate electrode. The top of the doped poly may be below, at, or above the silicon surface.

Figure 7:
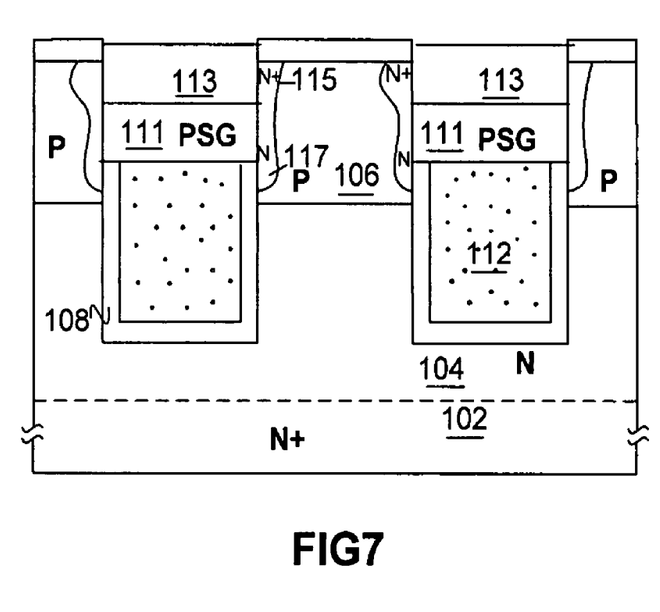
FIG. 7 is a cross-sectional structural diagram depicting a stage in a fabrication process for a semiconductor device, in accordance with an embodiment.

In FIG. 7, using a thermal diffusion process, a more heavily doped N+ diffusion 115 from the polysilicon 113 and an N diffusion 117 from the doped oxide film PSG 111 are formed in the body region 106 through the trench walls.

Figure 8:
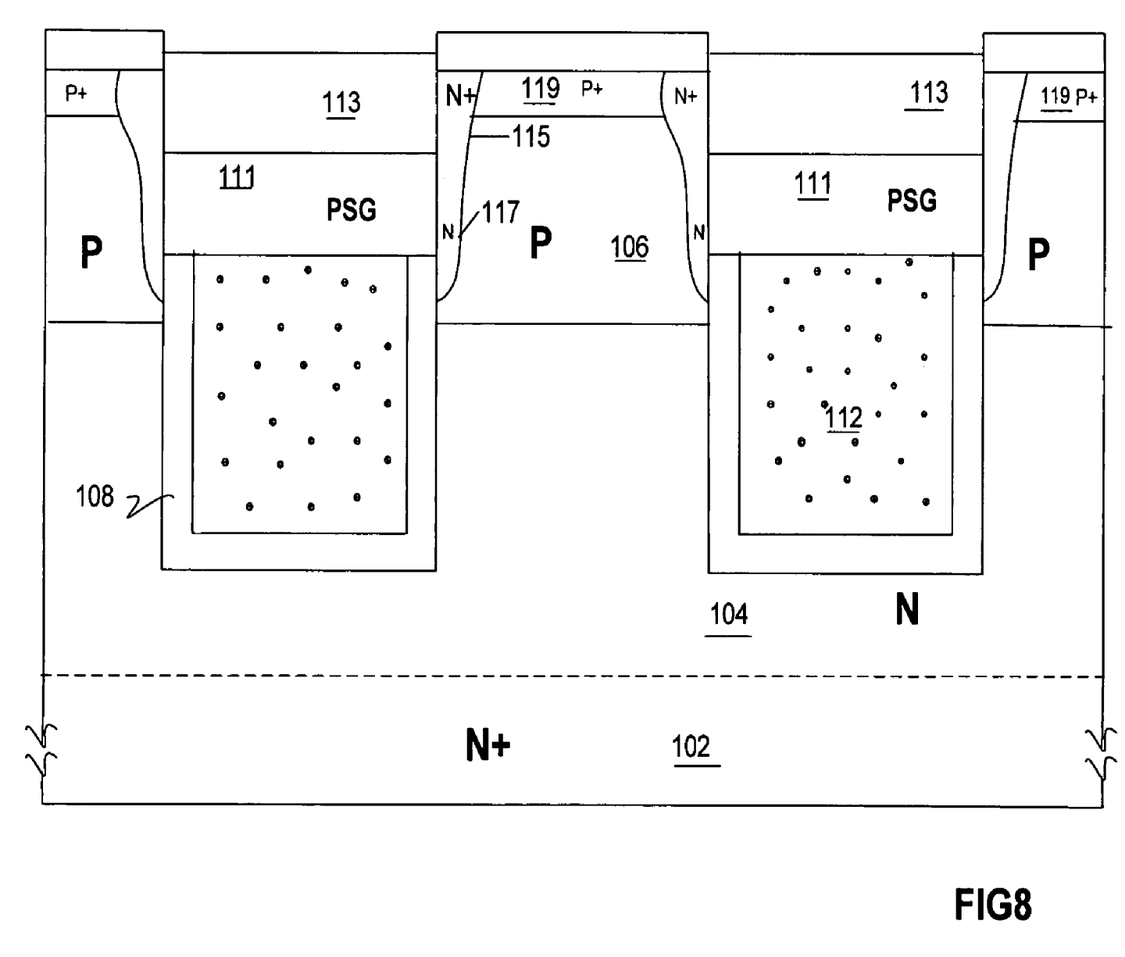
FIG. 8 is a cross-sectional structural diagram depicting a stage in a fabrication process for a semiconductor device, in accordance with an embodiment.

In FIG. 8, a P+ layer 119 is implanted (or otherwise formed) at the top of the body region 106.

Figure 9:
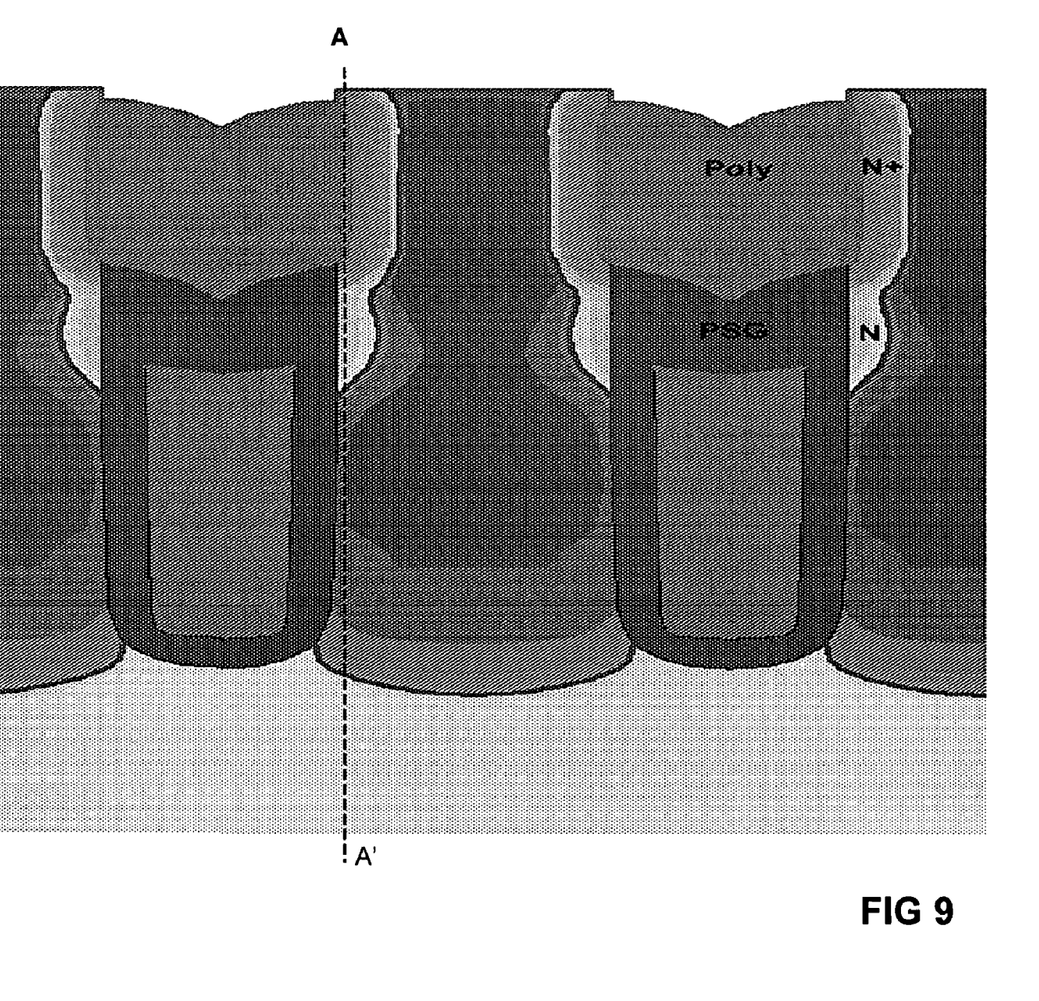
FIG. 9 is a cross-sectional structural diagram depicting a stage in a fabrication process for a semiconductor device, in accordance with an embodiment.

With reference to FIG. 9, stimulated cross section of an ultra-high-density field-effect transistor is shown.

Figure 10:
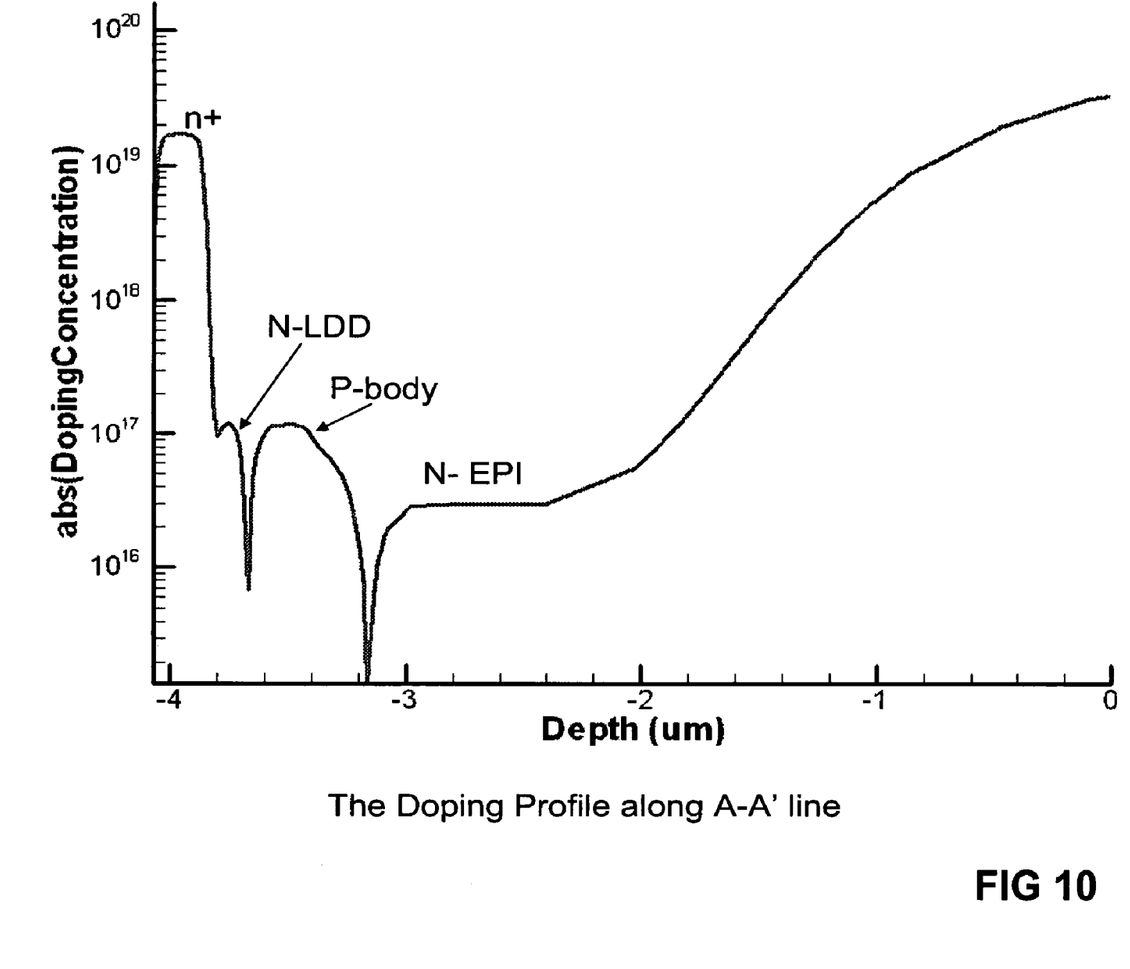
FIG. 10 is a graph of simulation data on an ultra-high-density FET, in accordance with an embodiment.

With reference to FIG. 10, a graph depicts the doping profile along the A-A' line of FIG. 9.

Figure 11:
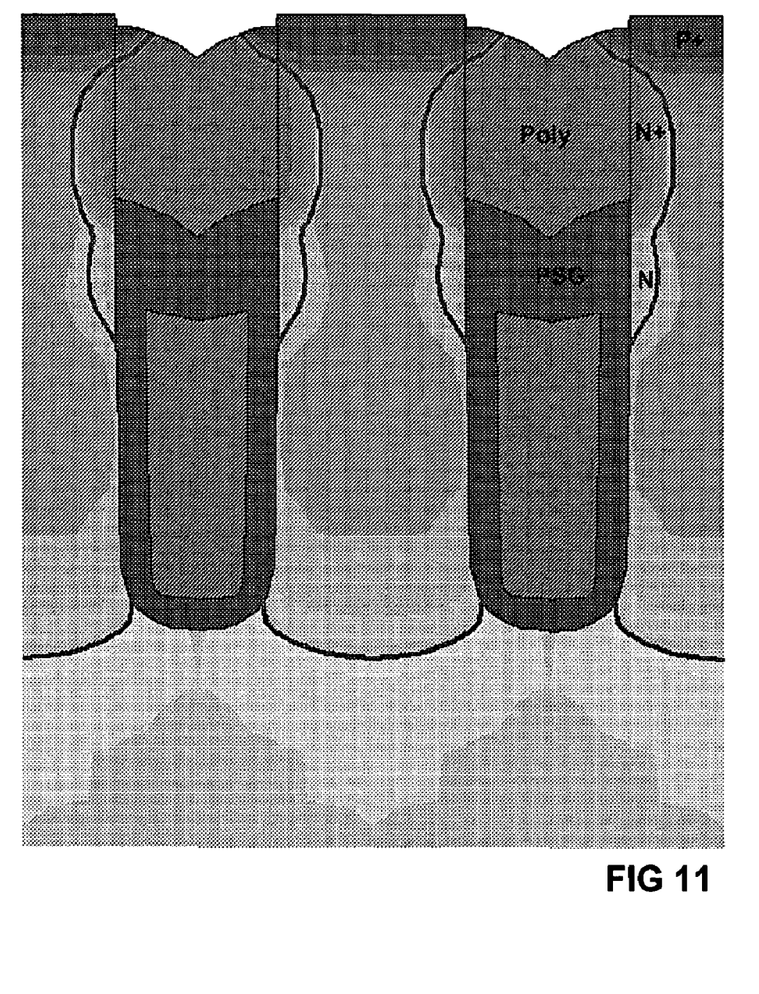
FIG. 11 is a graph of the doping profile, in accordance with an embodiment.

With reference to FIG. 11, additional stimulation data of an ultra-high-density field-effect transistor is shown.

Figure 12:
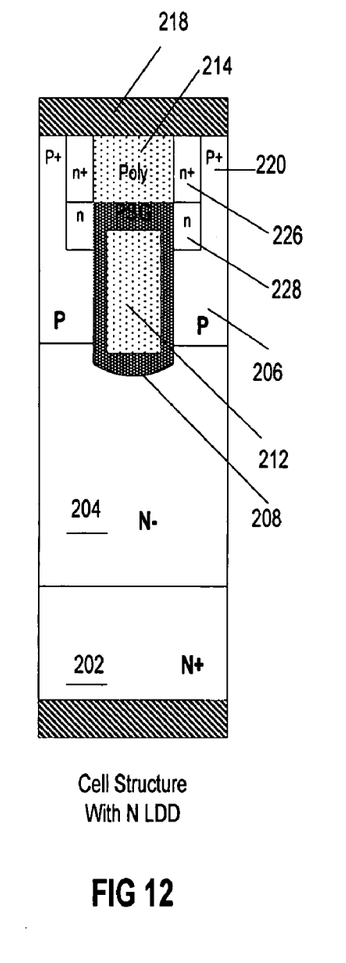
FIG. 12 is a cross-sectional structural diagram depicting a cell structure with an n-type lightly doped diffused (N-LDD), in accordance with an embodiment.
Figure 13:
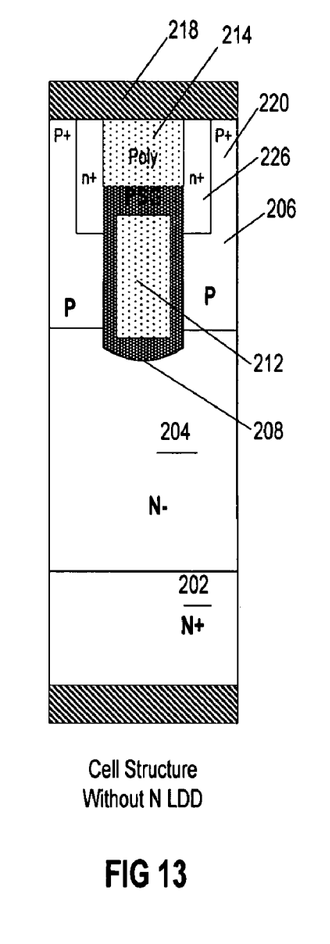
FIG. 13 is a cross-sectional structural diagram depicting a cell structure without an n-type lightly doped diffusion (N-LDD), in accordance with an embodiment.

With reference to FIG. 12, a cell structure is depicting with an N-type lightly doped diffusion (LDD) 228 is shown. This cross-sectional structural diagram depicts an ultra-high density field effect transistor, in accordance with an embodiment. A drain region 202 adjoins a drift region 204. An insulation trench 208 is formed having a conductive gate 212 with phosphosilicate glass (PSG) on its top is shown. A gate dielectric layer contacts an LDD 228, a body 206 and the drift region 204. A gate electrode 212 is positioned within the insulation trench 208 to produce an inversion layer in the body 206 and creating a charge flow between source 226 and the drift 204. A body contact region 220 provides connection between the source 226 and body 206. A polysilicon layer 214 provides connection to the source 226 and the metallization layer 218. FIG. 13 depicts a similar cell structure, without the N-type lightly doped diffusion.

Figure 14:
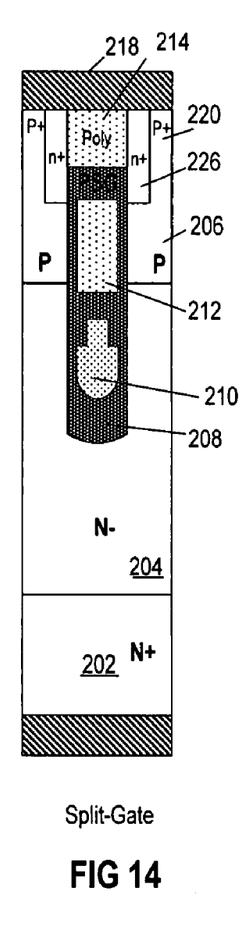
FIG. 14 is a cross-sectional structural diagram depicting a split gate, in accordance with an embodiment.

With reference to FIG. 14, a cross-sectional structural diagram depicts an ultra-high density field effect transistor, in accordance with an embodiment. A drain region 202 adjoins a drift region 204. An insulation trench 208 is formed of a dielectric layer, contacting an LDD 228, a body 206 and the drift region 204. A gate electrode 212 is positioned within the insulation trench 208 to generate an inversion layer in the body 206, allowing carriers to flow between source 226 and the drift 204. A second electrode 210 is positioned within the insulation trench 208 and is typically connected to the source 226. A body contact region 220 provides connection between the source 226 and body 206. A polysilicon or polycide layer 214 provides connection to the source 226 and the metallization layer 218.

Figure 15:
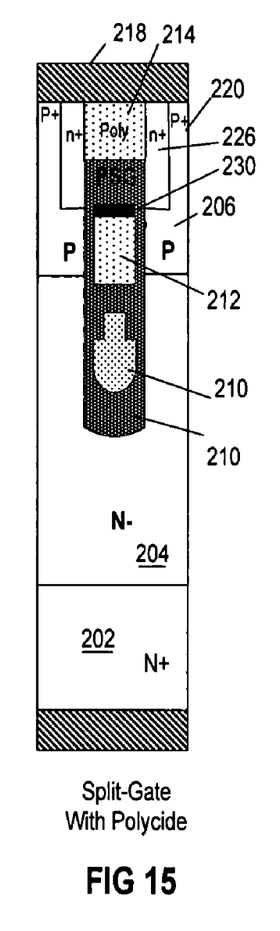
FIG. 15 is a cross-sectional structural diagram depicting a split gate with polycide, in accordance with an embodiment.

FIG. 15 shows an embodiment similar to the embodiment of FIG. 14, with a polycide layer 230 on the gate 212.

Figure 16:
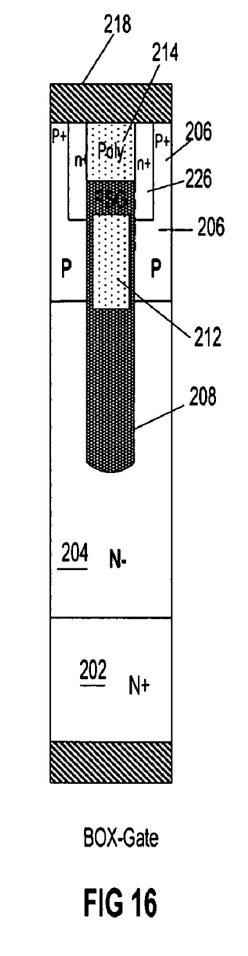
FIG. 16 is a cross-sectional structural diagram depicting a BOX gate, in accordance with an embodiment.

FIG. 16 shows an embodiment similar to the embodiment of FIG. 14, without the second gate electrode 210.

Figure 17A:
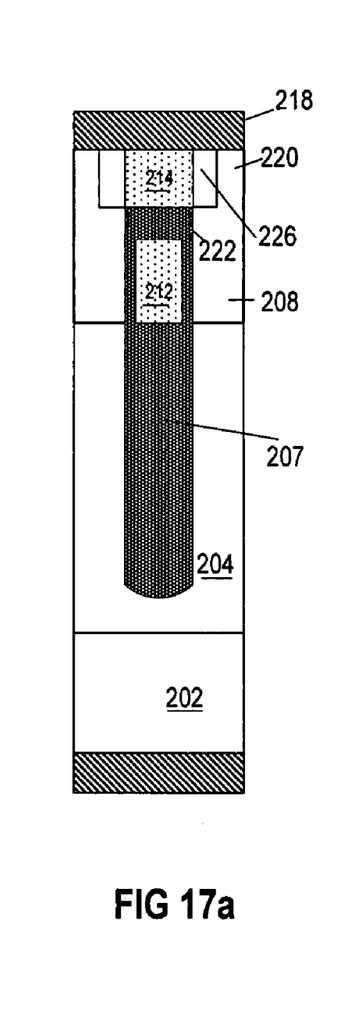
FIG. 17(a) is a cross-sectional structural diagram depicting a device in which fixed or permanent charge provides an inverted surface for carrier conduction, in accordance with an embodiment.
Figure 17B:
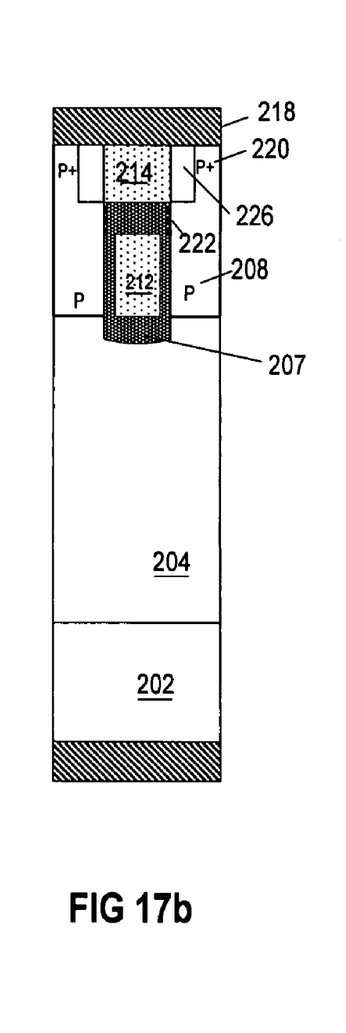
FIG. 17(b) is a cross-sectional structural diagram depicting a device having a thick bottom oxide and in which fixed charge provides an inverted surface for carrier conduction, in accordance with an embodiment.
Figure 17C:
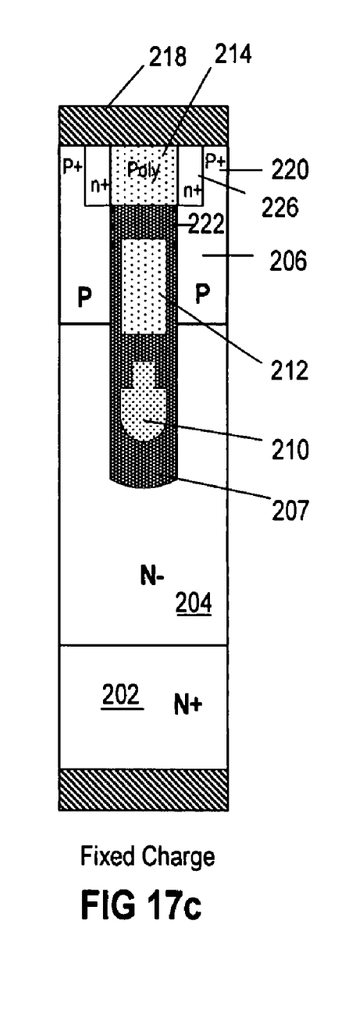
FIG. 17(c) is a cross-sectional structural diagram depicting a split gate device in which fixed charge provides an inverted surface for carrier conduction, in accordance with an embodiment.

FIG. 17(a) shows an embodiment including permanent charges 222 at the surface of an insulation trench 207 formed of dielectric material such as oxide, extending from the gate 212 and an underlapped source 226. This permanent charge 222 forms an induced inversion layer in the adjacent region of the body. FIG. 17(b) shows an embodiment similar to FIG. 17(a), where the insulation trench 207 extends into the drift region 204. FIG. 17(c) shows an embodiment similar to FIG. 17(b), including a split gate 212 and 210.

For maximal density, a small body contact area is required. This small body contact area can be obtained by keeping the doped polysilicon away from the top of the mesa during the source diffusion. This goal is accomplished by etching the n-type doped poly so it is lower than the surface of the semiconductor as shown by the dashed line in FIG. 6. Doped polysilicon and silicon glass are n+ sidewall dopant sources that yield extremely high density. It is possible to use a sealer oxide under the PSG layer or an oxynitride. Arsenosilicate, n-type germanosilicate or stibosilicate glasses or mixtures of the glasses are alternatives to the PSG.

The figures show the fabrication of a discrete trench MOSFET. The fabrication of these devices as part of an integrated circuit is also contemplated.

According to various embodiments, there is provided: A method for fabricating a vertical-current-flow field-effect transistor, comprising the actions of: forming at least one trench in a body of semiconductor material; forming a gate electrode within said at least one trench, wherein said gate electrode is separated from said semiconductor material by an insulation material; forming a layer of doped glass above said gate electrode; and forming a layer of doped polysilicon material above said layer of doped silicon glass.

According to various embodiments, there is provided: A vertical-current-flow device includes a trench which includes an insulated gate and which extends down into first-conductivity-type semiconductor material. A doped glass layer is positioned above the insulated gate and a doped polysilicon layer is positioned above the doped glass layer. Source and body diffusions of opposite conductivity types are positioned adjacent to a sidewall of the trench. A drift region is positioned to receive majority carriers which have been injected by the source, and which have passed through the body diffusion. A drain region is positioned to receive majority carriers which have passed through the drift region. The gate is capacitively coupled to control inversion of a portion of the body region.

According to various embodiments, there is provided: A vertical-current-flow device, comprising: a trench including an insulated gate; a layer of doped glass above said insulated gate; and a layer of doped polysilicon above said layer of doped glass.

According to various embodiments, there is provided: A vertical-current-flow device, comprising: a trench including an insulated gate; a dielectric layer such as oxide above said insulated gate; a layer of doped glass above said dielectric layer; and a layer of doped polysilicon above said layer of doped glass.

According to various embodiments, there is provided: A method of operating a vertical-current-flow semiconductor device, comprising the actions of: using an insulated gate in a trench to control inversion of a body diffusion, said trench containing a doped glass layer and a doped polysilicon layer; in a drift region, receiving majority carriers which have been injected by a source, and which have passed through said body diffusion; and in a drain region, receiving majority carriers which have passed through said drift region; wherein said gate is capacitively coupled to control inversion of a portion of said body region.

According to various embodiments, there is provided: A high density vertical current flow device, comprising: a trench including an insulated gate; a layer of dielectric material such as oxide above said insulated gate; permanent charge that forms an inversion layer at the silicon surface adjacent to the dielectric layer; and a layer of doped polysilicon above said dielectric layer.

According to various embodiments, there is provided: A high-density vertical power device, comprising: at least one active device area; at least one buried gate electrode, in a patterned trench within said active device area, which is capacitively coupled to control vertical current flow through semiconductor material adjacent to at least part of said buried gate electrode, between a source which lies alongside said trench and a drain which lies below said trench; and at least one buried source contact electrode, in said patterned trench, which makes contact to said source; wherein said buried gate electrode and said buried source contact electrode have patterns which are identical within said active device areas, but differ elsewhere.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Other semiconductor materials, such as silicon-germanium; germanium, carbon, silver and any other suitable material can optionally be used instead.

For another example, other modifications to source geometry can optionally be used, including additional gradation of dopant density and/or additional implants.

For another example, other modifications to drain geometry can optionally be used, including, for example, field plates, additional gradation of dopant density (e.g. due to a Phos and As dual-species source diffusion), additional implants, and/or permanent charge at the semiconductor surface of the drain to adjust surface conduction.

For another example, a dual-gate structure can optionally be used, e.g. in which a lower gate terminal has a thicker oxide and is connected to source voltage, and underlines the switching gate 112. This can be particularly advantageous in combination with embodiments which have thicker oxide on the lower part of the trench, as shown e.g. in the outer examples of FIG. 16. This can also combine synergistically with a trench gate which is contoured near its bottom corners, or has permanent charge to modify conduction.

As is well known in the field of vertical DMOS technology, the ruggedness of a device is improved by including deep P+ regions that reach avalanche breakdown before any other breakdown mechanism occurs. In some instances, this P+ region is included in every cell in a device constructed of cells, while in other instances, this P+ region is included in every nth cell. In an interdigitated structure, the P+ region may be included along the entire length of the source, or may be present every few microns.

The edge termination of the device is not discussed in this invention disclosure. However, as is well known, the device must be surrounded by a termination structure that goes into voltage breakdown at a voltage that is greater than the breakdown in the device interior. This requirement allows the current that occurs in breakdown to flow directly to the terminals, minimizing the probability that the device will be damaged.

The following applications may contain additional information and alternative modifications: Ser. No. 61/058,069 filed Jun. 2, 2008 and entitled "Edge Termination for Devices Containing Permanent Charge"; Ser. No. 61/060,488 filed Jun. 11, 2008 and entitled "MOSFET Switch"; Ser. No. 61/074,162 filed Jun. 20, 2008 and entitled "MOSFET Switch"; Ser. No. 61/076,767 filed Jun. 30, 2008 and entitled "Trench-Gate Power Device"; Ser. No. 61/080,702 filed Jul. 15, 2008 and entitled "A MOSFET Switch"; Ser. No. 61/084,639 filed Jul. 30, 2008 and entitled "Lateral Devices Containing Permanent Charge"; Ser. No. 61/084,642 filed Jul. 30, 2008 and entitled "Silicon on Insulator Devices Containing Permanent Charge"; Ser. No. 61/027,699 filed Feb. 11, 2008 and entitled "Use of Permanent Charge in Trench Sidewalls to Fabricate Un-Gated Current Sources, Gate Current Sources, and Schottky Diodes"; Ser. No. 61/125,892 filed Apr. 29, 2008 and entitled "Edge Termination for PN Junction Having Sub-Micron Junction Depth"; Ser. No. 61/028,783 filed Feb. 14, 2008 and entitled "Techniques for Introducing and Adjusting the Dopant Distribution in a Trench MOSFET to Obtain Improved Device Characteristics"; Ser. No. 61/091,442 filed Aug. 25, 2008 and entitled "Devices Containing Permanent Charge"; Ser. No. 61/134,149 filed Jul. 7, 2008 and entitled "Semiconductor Devices Having Charge Induced Junctions"; Ser. No. 61/118,664 filed Dec. 1, 2008 and entitled "An Improved Power MOSFET and Its Edge Termination"; Ser. No. 61/122,794 filed Dec. 16, 2008 and entitled "A Power MOSFET Transistor".

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A vertical-current-flow device, comprising:
    a trench, extending into a semiconductor material, including an insulated gate;
    a dielectric layer, which contains a dopant of a first conductivity type for said semiconductor material, above said insulated gate;
    source and body diffusions of first and second respective conductivity types in said semiconductor material, adjacent to at least one sidewall of said trench;
    a drift region in said semiconductor material, positioned to receive majority carriers which have been injected by said source, and which have passed through said body diffusion;
    a drain region of said first conductivity type in said semiconductor material, positioned to receive majority carriers which have passed through said drift region;
    a lightly doped diffusion of said first conductivity type, in said semiconductor material, adjacent said dielectric layer; and
    a layer of doped polysilicon above said dielectric layer.

2. The vertical-current-flow device of claim 1, wherein said insulated gate is a split gate.

3. The vertical-current-flow device of claim 2, wherein said insulated gate includes a polysilicon layer.

4. The vertical-current flow device of claim 1, further comprising permanent charge in said dielectric layer.

5. A method of operating a vertical-current-flow semiconductor device, comprising the actions of:
    using an insulated gate in a trench to control inversion of a body diffusion in a semiconductor material, said trench including a glass layer and a doped polysilicon layer;
    in a drift region in said semiconductor material, receiving majority carriers which have been injected by a first-conductivity-type source, and which have passed through said body diffusion and through a lightly doped first-conductivity-type region which is self-aligned to said glass layer; and
    in a first-conductivity-type drain region in said semiconductor material, receiving majority carriers which have passed through said drift region;
    wherein said body region has a second conductivity type, and said gate is capacitively coupled to control inversion of a portion of said body region;
    and wherein said glass layer contains a species which is a first-conductivity-type dopant for said semiconductor material;
    and wherein said doped polysilicon layer also contains a species which is a first-conductivity-type dopant for said semiconductor material.

6. The method of claim 5, wherein said majority carriers are electrons.

7. The method of claim 5, further comprising a lightly doped diffusion between said source and said body diffusion.

8. The method of claim 5, wherein said insulated gate is a split gate.

9. The method of claim 5, further comprising permanent charge in said glass layer.

10. The method of claim 8 wherein said split gate includes a polysilicon layer.

11. The method of claim 5, wherein said first-conductivity-type dopant is an n-type dopant.

12. The method of claim 5, wherein said second conductivity type is p-type.

13. The method of claim 12, wherein said n-type dopant is phosphorus, arsenic or antimony.

* * * * *